(12) United States Patent
Sugawara

(10) Patent No.: US 6,828,039 B2
(45) Date of Patent: Dec. 7, 2004

(54) MAGNETORESISTIVE SENSOR AND MANUFACTURING METHOD THEREFOR

(75) Inventor: Takahiko Sugawara, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 35 days.

(21) Appl. No.: 10/097,211

(22) Filed: Mar. 13, 2002

(65) Prior Publication Data

US 2003/0087130 A1 May 8, 2003

(30) Foreign Application Priority Data

Nov. 5, 2001 (JP) ........................................ 2001-339416

(51) Int. Cl.$^7$ .............................................. G11B 05/39
(52) U.S. Cl. ...................... 428/621; 428/632; 428/34.1; 428/313.9; 428/323; 428/367; 428/398; 428/392; 428/698; 428/702; 360/313; 427/127
(58) Field of Search .......................... 427/127; 360/313, 360/324; 428/621, 313.9, 702, 632, 34.1, 156, 213, 313.3, 315.5, 315.9, 316.6, 323, 336, 367, 398, 692, 698

(56) References Cited

U.S. PATENT DOCUMENTS

2002/0054461 A1 * 5/2002 Fujiwara et al. ......... 360/324.1
2002/0145826 A1 * 10/2002 Zangari et al. ............. 360/135

FOREIGN PATENT DOCUMENTS

EP  1 052 520 A1  11/2000
JP  2001-143227    5/2001

OTHER PUBLICATIONS

Zhao, B., Monch, I., Vinzelberg, H., Muhl, T., Schneider, C., App. Phys. Let., 80(17), 2002, 3144–3146.*
JPO ABstract Translation of JP 2001–143227 A.*
Machine Translation of JP 2001–143227 A.*
(XP–002227891) Microstructure of Co–Al–O, pp. 5646–5652, Dec. 1, 1997.
(XP–000955283) Formation of carbon nanotubes and their filling with metallic fibers on ion–emitting field anodes, pp. 1626–1631, Aug. 1, 1998.

* cited by examiner

Primary Examiner—Kevin M. Bernatz
(74) Attorney, Agent, or Firm—Greer, Burns & Crain, Ltd.

(57) ABSTRACT

A magnetoresistive sensor including a lower electrode layer, a nanotube structure film composed of an insulator matrix and a plurality of nanotubes dispersively arranged in the insulator matrix, a magnetoresistive film provided on the nanotube structure film, and an upper electrode layer provided on the magnetoresistive film. Each nanotube is composed of a circular tubular nonmetal and a circular cylindrical metal surrounded by the circular tubular nonmetal. The nanotube structure film is partially etched at its central region to make conduction of the upper electrode layer and the lower electrode layer through the magnetoresistive film and the circular cylindrical metal of each nanotube present at the central region.

13 Claims, 6 Drawing Sheets

MAGNETORESISTIVE SENSOR AND MANUFACTURING METHOD THEREFOR

BACKGROUND OF THE INVENTION

1. Field of the Invention

The present invention relates to a magnetoresistive sensor for use in a magnetic recording device such as a magnetic disk drive and a magnetic tape drive.

2. Description of the Related Art

In association with a reduction in size and an increase in recording density of a magnetic disk drive in recent years, the flying height of a head slider has become smaller and it has been desired to realize contact recording/reproduction such that the head slider flies a very small height above a recording medium or comes into contact with the recording medium. Further, a conventional magnetic induction head has a disadvantage such that its reproduction output decreases with a decrease in peripheral speed of a magnetic disk as the recording medium (relative speed between the head and the medium) caused by a reduction in diameter of the magnetic disk. To cope with this disadvantage, there has recently extensively been developed a magnetoresistive head (MR head) whose reproduction output does not depend on the peripheral speed and capable of obtaining a large output even at a low peripheral speed. Such a magnetoresistive head is now a dominating magnetic head. Further, a magnetic head utilizing a giant magnetoresistive (GMR) effect is also commercially available at present.

With higher-density recording in a magnetic disk drive, a recording area of one bit decreases and a magnetic field generated from the medium accordingly becomes smaller. The recording density of a magnetic disk drive currently on the market is about 10 Gbit/in$^2$, and it is rising at an annual rate of about 200%. It is therefore desired to develop a magnetoresistive sensor and a magnetoresistive head which can support a minute magnetic field range and can sense a change in small external magnetic field.

At present, a spin valve magnetoresistive sensor utilizing a spin valve GMR effect is widely used in a magnetic head. In such a magnetoresistive sensor having a spin valve structure, a magnetization direction in a free ferromagnetic layer (free layer) is changed by a signal magnetic field from a recording medium, so that a relative angle of this magnetization direction to a magnetization direction in a pinned ferromagnetic layer (pinned layer) is changed, causing a change in resistance of the magnetoresistive sensor. In the case of using this magnetoresistive sensor in a magnetic head, the magnetization direction in the pinned layer is fixed to a direction along the height of a magnetoresistive element, and the magnetization direction in the free layer in the condition where no external magnetic field is applied is generally designed to a direction along the width of the magnetoresistive element, which direction is perpendicular to the pinned layer.

Accordingly, the resistance of the magnetoresistive sensor can be linearly increased or decreased according to whether the direction of the signal magnetic field from the magnetic recording medium is parallel or antiparallel to the magnetization direction of the pinned layer. Such a linear resistance change facilitates signal processing in the magnetic disk drive. In the conventional magnetoresistive sensor, a sense current is passed in a direction parallel to the film surface of the magnetoresistive element to read a resistance change according to an external magnetic field. In such a case of a CIP (Current In the Plane) structure that a current is passed in a direction parallel to the GMR film surface, the output from the sensor decreases with a decrease in sense region defined by a pair of electrode terminals. Further, in the spin valve magnetoresistive sensor having the CIP structure, insulating films are required between the GMR film and an upper magnetic shield and between the GMR film and a lower magnetic shield.

That is, the distance between the upper and lower magnetic shields is equal to the sum of the thickness of the GMR film and a value twice the thickness of each insulating film. At present, the thickness of the insulating film is about 20 nm at the minimum. Accordingly, the distance between the upper and lower magnetic shields becomes equal to the sum of the thickness of the GMR film and about 40nm. However, with this distance, it is difficult to support a reduction in length of a recording bit on the recording medium, and the current CIP spin valve magnetoresistive sensor cannot meet the requirement that the distance between the magnetic shields is to be reduced to 40 nm or less.

In these circumstances, it is considered that a magnetic head having a CIP structure utilizing a spin valve GMR effect can support a recording density of 20 to 40 Gbit/in$^2$ at the maximum. Even by applying specular scattering as a latest technique, the maximum recording density is considered to be 60 Gbit/in$^2$. As mentioned above, the increase in recording density of a magnetic disk drive is rapid, and it is expected that a recording density of 80 Gbit/in$^2$ will be desired by 2002. When the recording density becomes 80 Gbit/in$^2$ or higher, it is very difficult to support such a high recording density even by using a CIP spin valve GMR magnetic head to which the latest specular scattering is applied, from the viewpoints of output and the distance between the magnetic shields.

As a post spin valve GMR intended to cope with the above problem, there have been proposed a tunnel MR (TMR) and a GMR having a CPP (Current Perpendicular to the Plane) structure such that a current is passed in a direction perpendicular to the GMR film surface. The TMR has a structure that a thin insulating layer is sandwiched between two ferromagnetic layers. The amount of a tunnel current passing across the insulating layer is changed according to the magnetization directions in the two ferromagnetic layers. The TMR shows a very large resistance change and has a good sensitivity, so that it is expected as a promising post spin valve GMR.

On the other hand, in the case of the GMR having the CPP structure, the output increases with a decrease in sectional area of a portion of the GMR film where a sense current is passed. This feature of the CPP structure is a large advantage over the CIP structure. The TMR is also considered to be a kind of CPP structure, because a current is passed across the insulating layer from one of the ferromagnetic layers to the other ferromagnetic layer. Therefore, the TMR also has the above advantage.

FIG. 1 shows a schematic sectional view of a magnetoresistive sensor 2 having a CPP structure in the prior art. The magnetoresistive sensor 2 is composed of a lower electrode layer 4, an insulator matrix 6, a magnetoresistive film 8, and an upper electrode layer 10. A contact hole 12 is formed at a substantially central portion of the insulator matrix 6. The magnetoresistive film 8 is in contact with the lower electrode layer 4 at the contact hole 12. A sense current is passed from the upper electrode layer 10 through the contact hole 12 of the magnetoresistive film 8 toward the lower electrode layer 4.

Dry etching suitable for microfabrication is adopted for the formation of the contact hole 12. The relation between the output ΔR from the magnetoresistive sensor 2 and the diameter D of the contact hole 12 is expressed as follows:

$$\Delta R \propto 1/D^2$$

In most devices used in the fields of information processing, communication, magnetic recording, optical recording, etc., the electrical connection of two conductors between which an insulator is interposed is established by a circular hole (contact hole) formed in the insulator. It is general that the contact hole is formed by dry etching suitable for microfabrication of devices.

Dry etching is a process including decomposing a supplied gas by a plasma to generate active species such as ions and radicals, and exposing a substrate to the active species to cause a reaction between the active species and a material to be etched, thereby performing patterning and resist removal. However, the minimum diameter of a contact hole formed by a current dry etching technique is 200 nm in the case of using an i-line stepper or 100 nm even in the case of using an FIB (Focused Ion Beam). In the latter case, there is an intrinsic problem that metal atoms adhere to a sidewall.

To improve the performance and characteristics of a magnetoresistive sensor, microscopic structure control on the order of nanometers is required and it is therefore necessary to form a microscopic contact hole. However, such a microscopic contact hole cannot be formed by the current dry etching technique. In addition, etching uniformity and pattern size controllability are also required.

SUMMARY OF THE INVENTION

It is therefore an object of the present invention to provide a magnetoresistive sensor having a contact hole of microscopic size on the order of nanometers.

In accordance with an aspect of the present invention, there is provided a magnetoresistive sensor comprising upper and lower electrode layers; a conducting path layer provided between said upper and lower electrode layers, said conducting path layer being formed by arranging a cylinder in an insulator, said cylinder comprising a tubular nonmetal and a cylindrical metal surrounded by said tubular nonmetal; and a magnetoresistive film provided between said conducting path layer and one of said upper and lower electrode layers.

In accordance with another aspect of the present invention, there is provided a magnetoresistive sensor comprising upper and lower electrode layers; a conducting path layer provided between said upper and lower electrode layers, said conducting path layer being formed by arranging a cylindrical metal in an insulator, said conducting path layer having a first region and a second region smaller in film thickness than said first region; and a magnetoresistive film provided between said conducting path layer and one of said upper and lower electrode layers.

In accordance with a further aspect of the present invention, there is provided a magnetoresistive sensor comprising upper and lower electrode layers; a conducting path layer provided between said upper and lower electrode layers, said conducting path layer being formed by arranging a cylindrical metal having a single-layer structure in an insulator; and a magnetoresistive film provided between said conducting path layer and one of said upper and lower electrode layers.

Preferably, the tubular nonmetal contains carbon, and the cylindrical metal contains chromium. The insulator is formed of $SiO_2$.

In accordance with a still further aspect of the present invention, there is provided a manufacturing method for a magnetoresistive sensor, comprising the steps of depositing a lower electrode layer on a substrate; forming a cylindrical metal on said lower electrode layer; depositing an insulator on said lower electrode layer after forming said cylindrical metal so that said cylindrical metal is embedded in said insulator to thereby form a conducting path layer; depositing a magnetoresistive film on said conducting path layer; and depositing an upper electrode layer on said magnetoresistive film.

Preferably, the manufacturing method further comprises the steps of forming a resist pattern on said conducting path layer before depositing said magnetoresistive film; and partially etching said conducting path layer by using said resist pattern as a mask.

In accordance with a still further aspect of the present invention, there is provided a magnetoresistive sensor comprising a lower electrode layer; a nanotube structure film provided on said lower electrode layer, said nanotube structure film comprising an insulator matrix and a plurality of nanotubes dispersively arranged in said insulator matrix; a magnetoresistive film provided on said nanotube structure film; and an upper electrode layer provided on said magnetoresistive film; each of said nanotubes comprising a circular tubular nonmetal and a circular cylindrical metal surrounded by said circular tubular nonmetal; said nanotube structure film being partially etched at a central region thereof to make conduction of said upper electrode layer and said lower electrode layer through said magnetoresistive film and said circular cylindrical metal of each nanotube present at said central region.

Preferably, the circular tubular nonmetal is formed of carbon, and the circular cylindrical metal is formed of chromium. The insulator matrix is formed of $SiO_2$.

In accordance with a still further aspect of the present invention, there is provided a manufacturing method for a magnetoresistive sensor, comprising the steps of depositing a lower electrode layer on a substrate; forming a first resist pattern on said lower electrode layer; etching said lower electrode layer by using said first resist pattern as a mask to form said lower electrode layer into a desired shape; forming a plurality of nanotubes of Cr—C on said lower electrode layer; depositing an insulator matrix on said lower electrode layer so that said plurality of nanotubes are embedded in said insulator matrix to form a nanotube structure film; forming a second resist pattern on said nanotube structure film; etching said nanotube structure film by using said second resist pattern as a mask to remove an unwanted portion of said nanotube structure film; forming a third resist pattern on said nanotube structure film; etching a central region of said nanotube structure film so that the top of each nanotube present at said central region is exposed, by using said third resist pattern as a mask; depositing a magnetoresistive film on said nanotube structure film; depositing an upper electrode layer on said magnetoresistive film; forming a fourth resist pattern on said upper electrode layer; and etching said upper electrode layer by using said fourth resist pattern as a mask to form said upper electrode layer into a desired shape.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 6a is a photographic view of the nanotube observed by a transmission electron microscope;

FIG. 6b is an enlarged view of a portion denoted by an arrow 34 in FIG. 6a; and

FIG. 6c is an enlarged view of a portion denoted by an arrow 36 in FIG. 6a.

DESCRIPTION OF THE PREFERRED EMBODIMENTS

Figure 2:
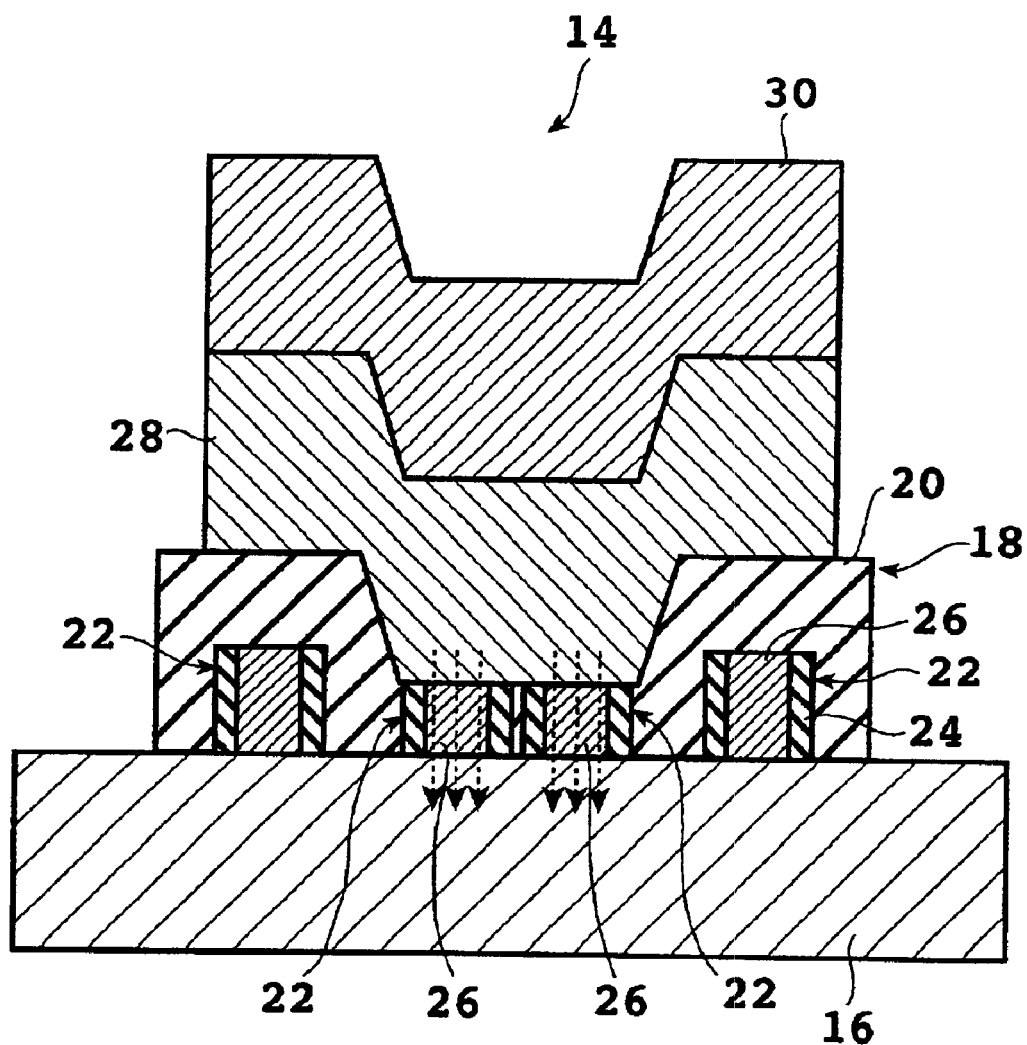
FIG. 2 is a schematic sectional view of a magnetoresistive sensor according to a preferred embodiment of the present invention.

Referring to FIG. 2, there is shown a schematic sectional view of a magnetoresistive sensor 14 having a CPP structure according to a preferred embodiment of the present invention. The magnetoresistive sensor 14 is composed of a lower electrode layer 16, a nanotube structure film 18 formed on the lower electrode layer 16, a magnetoresistive film (MR film) 28 formed on the nanotube structure film 18, and an upper electrode layer 30 formed on the MR film 28. Each of the lower electrode layer 16 and the upper electrode layer 30 is formed of Cu or the combination of Cu and Au. The nanotube structure film 18 includes an insulator matrix 20 formed of $SiO_2$, for example, and a plurality of nanotubes 22 dispersively arranged in the insulator matrix 20.

Each nanotube 22 is composed of a circular tubular nonmetal 24 and a circular cylindrical metal 26 surrounded by the circular tubular nonmetal 24. The circular tubular nonmetal 24 is formed of carbon, for example, and the circular cylindrical metal is formed of chromium, for example. The nanotube structure film 18 is partially etched at its central region so that the top of a part of the nanotubes 22 is exposed. The upper electrode layer 30 and the lower electrode layer 16 are in conduction at this etched region through the magnetoresistive film 28 and the circular cylindrical metals 26 of the exposed nanotubes 22. That is, the circular cylindrical metals 26 of the nanotubes 22 present at the etched region of the nanotube structure film 18 form a contact hole.

Figure 3:
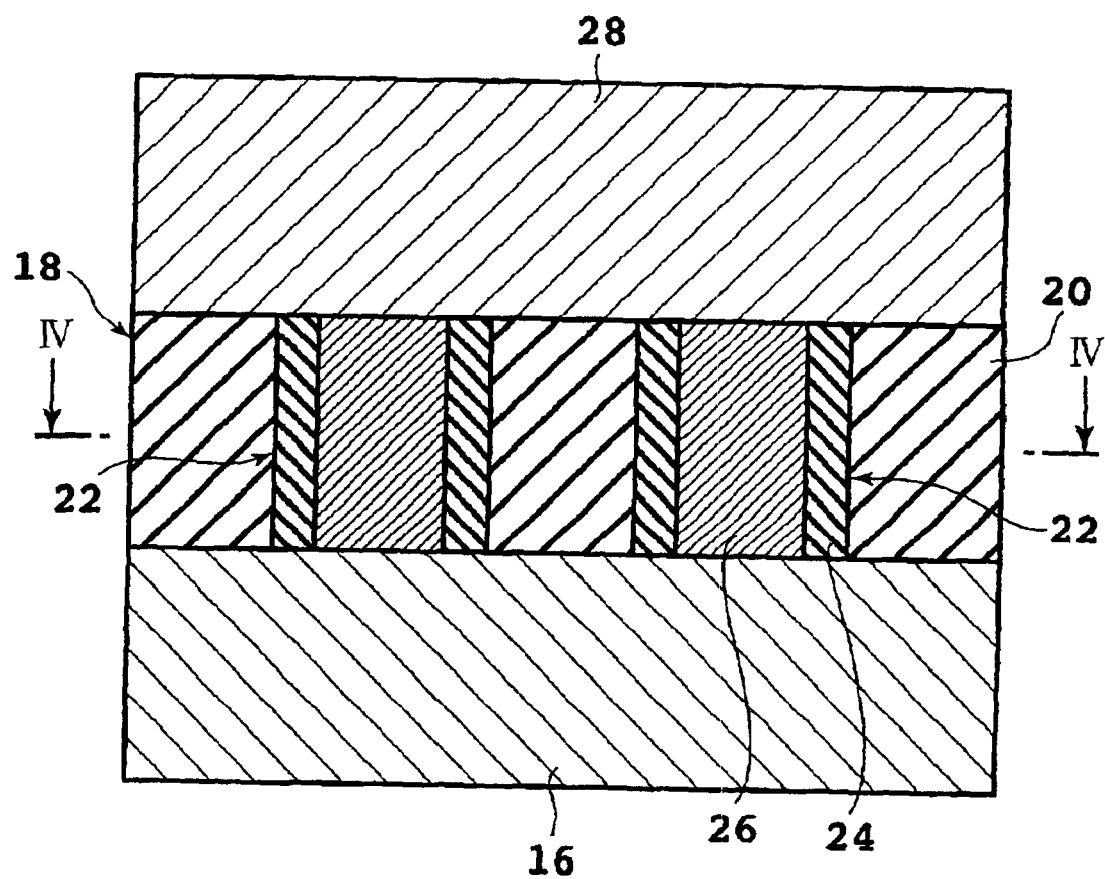
FIG. 3 is an enlarged sectional view of an essential part of the magnetoresistive sensor shown in FIG. 2.
Figure 4:
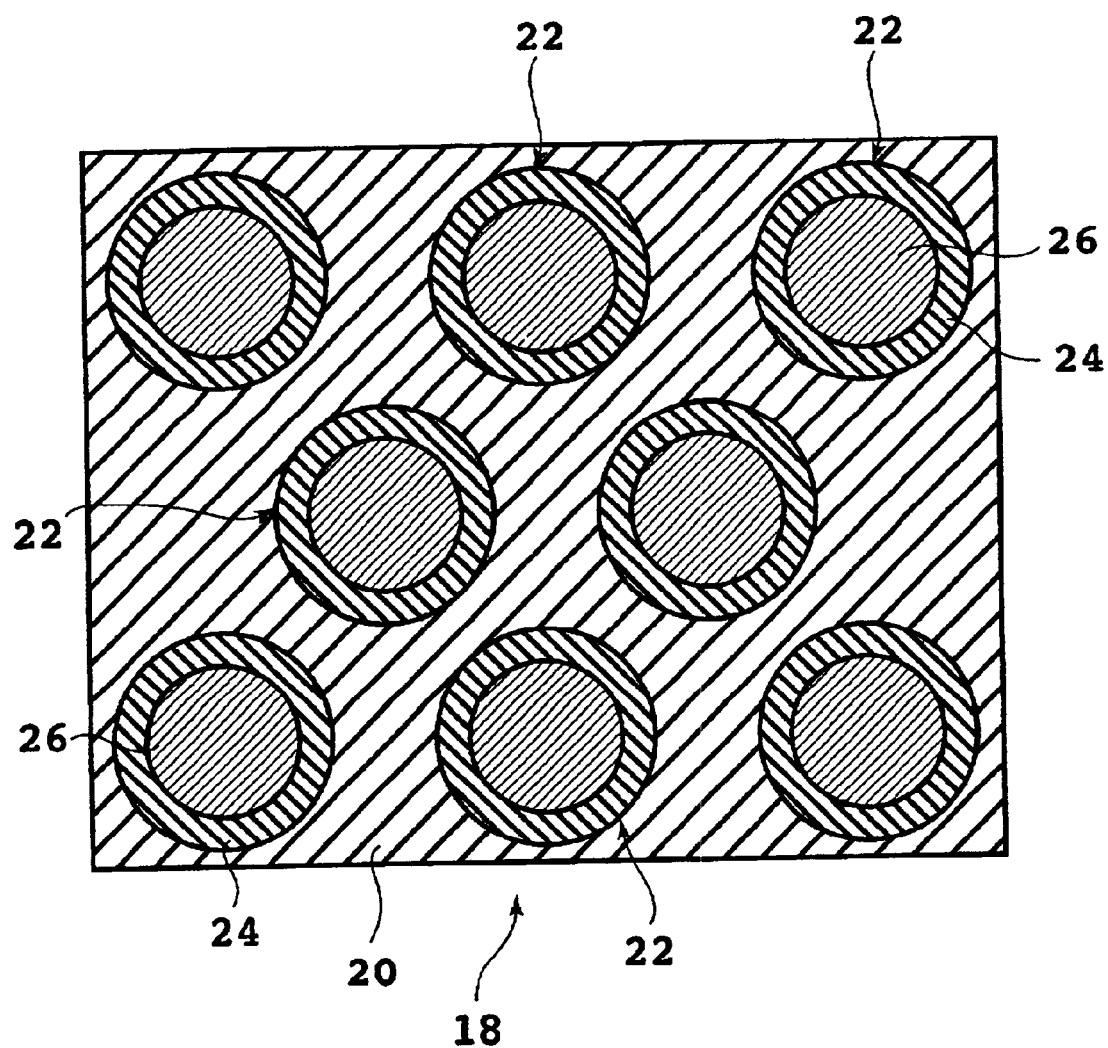
FIG. 4 is a cross section taken along the line IV—IV in FIG. 3.
Figure 5:
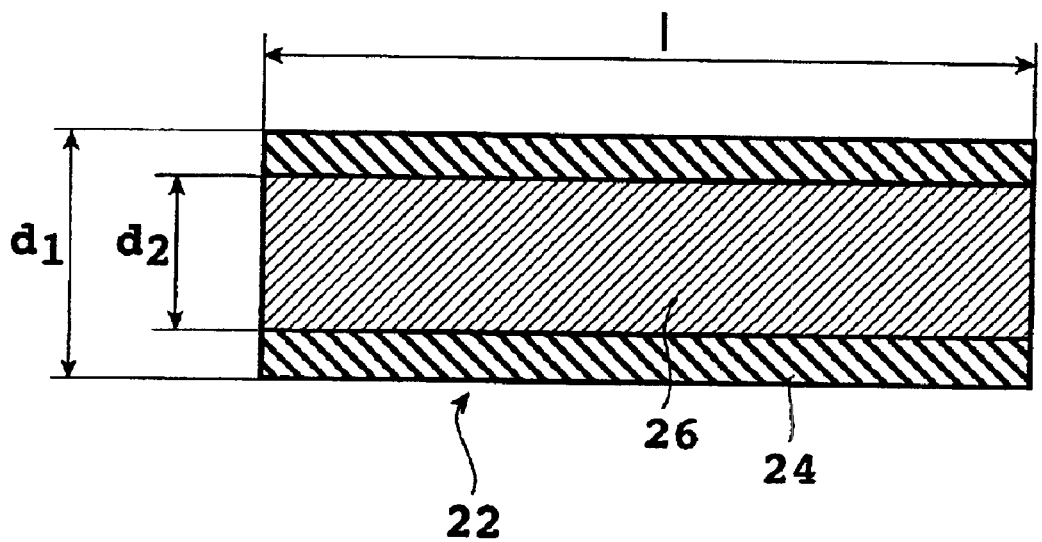
FIG. 5 is a longitudinal sectional view of a nanotube.

FIG. 3 is an enlarged sectional view of an essential part of the preferred embodiment shown in FIG. 2, FIG. 4 is a cross section taken along the line IV—IV in FIG. 3, and FIG. 5 is a longitudinal sectional view of each nanotube 22. As shown in FIG. 5, the circular tubular nonmetal 24 of each nanotube 22 has an outer diameter $d_1$ and an inner diameter $d_2$, and the circular cylindrical metal 26 of each nanotube 22 has the diameter $d_2$. Each nanotube 22 has a length l. As apparent from FIGS. 2 to 4, the magnetoresistive film 28 is connected through the nanotubes 22 to the lower electrode layer 16 at the etched region of the nanotube structure film 18. Accordingly, when a sense current is passed between the upper electrode layer 30 and the lower electrode layer 16, the sense current concentrically flows in the circular cylindrical metals 26 having a low resistivity rather than in the insulator matrix 20 and the circular tubular nonmetals 24 each having a high resistivity. As a result, it is possible to obtain the same effect as that obtained by reducing the diameter of a contact hole.

Figure 1:
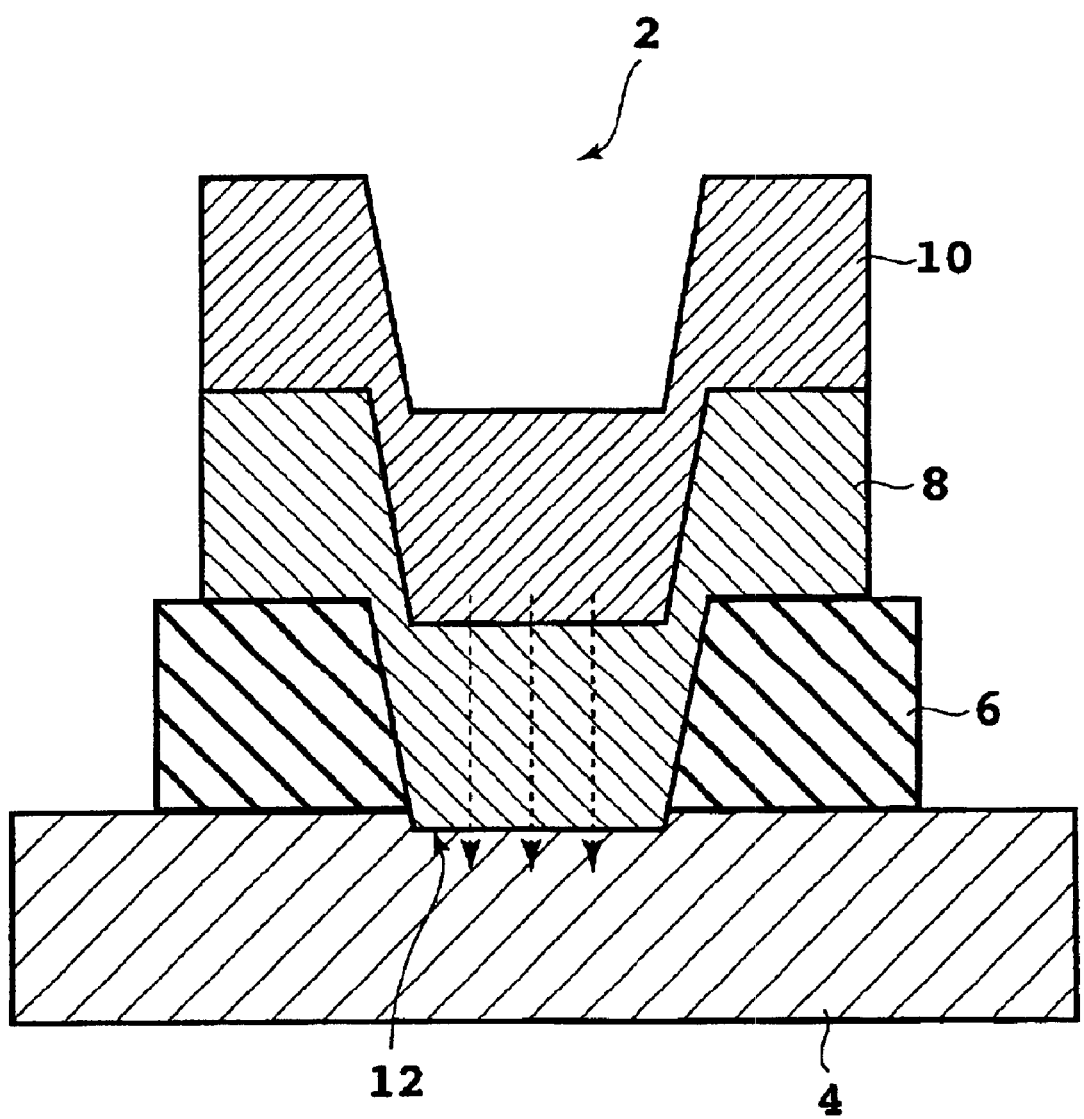
FIG. 1 is a schematic sectional view of a prior art magnetoresistive sensor.

The prior art magnetoresistive sensor 2 shown in FIG. 1 provides an output inversely proportional to the square of the diameter of a portion of the magnetoresistive film 8 formed in contact with the lower electrode layer 4, i.e., the diameter of the contact hole 12. To the contrary, the magnetoresistive sensor 14 according to the preferred embodiment shown in FIG. 2 provides an output inversely proportional to the sectional area and number of the circular cylindrical metals 26 formed in contact with the magnetoresistive film 28 and the lower electrode layer 16. In the above configuration including the nanotube structure film 18, the lower electrode layer 16 formed in contact with one of the opposite surfaces of the nanotube structure film 18, and the magnetoresistive film 28 formed in contact with the other surface of the nanotube structure film 18, the diameter of a contact portion between the circular cylindrical metals 26 and the lower electrode layer 16, i.e., the apparent diameter D' of a contact hole, will now be calculated. The following assumptions are used for the calculation.

(1) The number of the circular cylindrical metals 26 formed in contact with the magnetoresistive film 28 and the lower electrode layer 16 is n.

(2) Each circular cylindrical metal 26 has the diameter $d_2$.

(3) The contact portion of each circular cylindrical metal 26 formed in contact with the magnetoresistive film 28 and the lower electrode layer 16 is circular.

On the above assumptions, the apparent diameter D' of the contact hole is expressed as follows:

$$D' = d_2 \cdot n^{1/2} \quad (1)$$

Figures 6A, 6B, 6C:
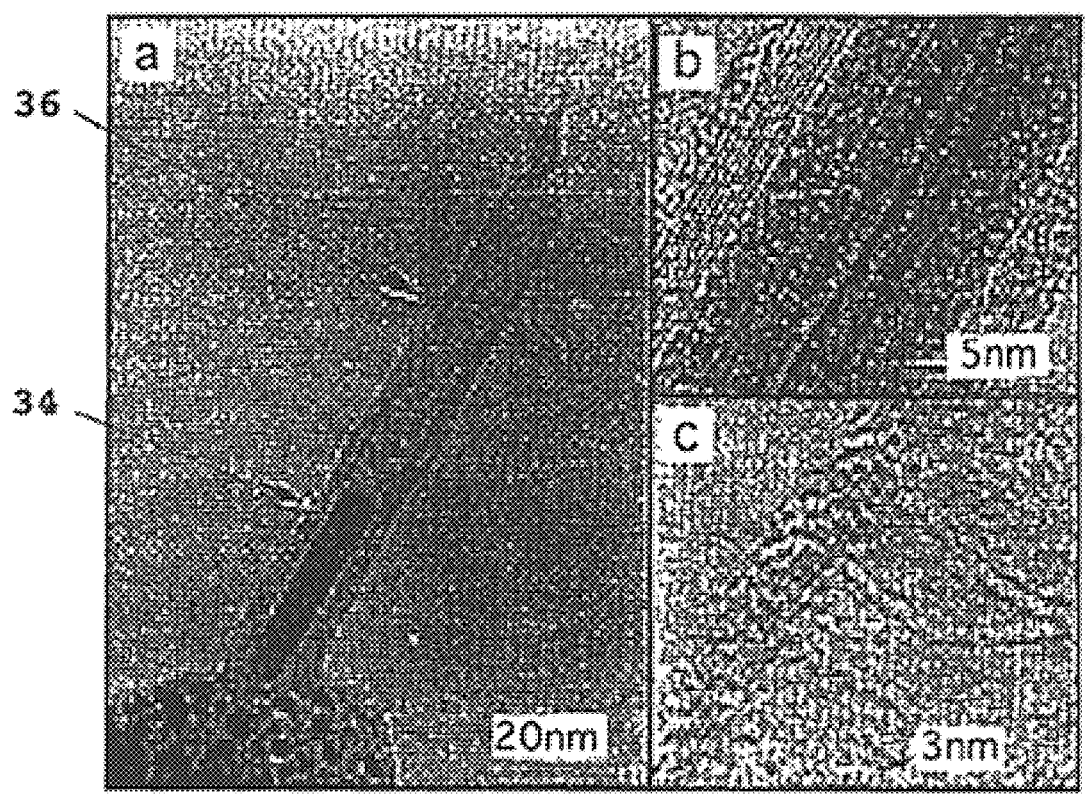

As an example of each nanotube 22 having the circular tubular nonmetal 24 and the circular cylindrical metal 26 surrounded by the circular tubular nonmetal 24, Cr—C is known. FIG. 6a shows a photographic view of Cr—C observed by a transmission electron microscope Formation of carbon nanotubes and their filling with metallic fibers on ion-emitting field anodes: J. Appl. Phys., 84(3), 1626 (1998)). As apparent from FIG. 6a, the Cr—C forms a structure that a circular tubular nonmetal of C surrounds a circular cylindrical metal of Cr, i.e., forms a so-called nanotube. FIG. 6b is an enlarged view of a portion denoted by an arrow 34 in FIG. 6a, and FIG. 6c is an enlarged view of a portion denoted by an arrow 36 in FIG. 6a. As apparent from FIG. 6b, the diameter of the circular cylindrical metal of Cr is about 8 nm.

There will now be described a manufacturing method for the magnetoresistive sensor 14 according to the preferred embodiment. First, a Cu film having a thickness of 500 nm as the lower electrode layer 16 is deposited on a substrate (not shown), and a resist pattern is next formed on the Cu film. The Cu film is next etched by using the resist pattern as a mask to form the lower electrode layer 16 having a desired shape. The plural Cr—C nanotubes 22 each having a length of 30 nm are next formed on the lower electrode layer 16. The formation of the nanotubes 22 is carried out in the following manner. The substrate on which the lower electrode layer 16 has been formed is placed as an anode in a Pyrex glass chamber.

After evacuating the chamber to $1 \times 10^{-6}$ Torr, naphthalene $C_{10}H_8$ and hexacarbonyl chromium $Cr(CO)_6$ gases are mixed at a given ratio, and the mixture is introduced at a total pressure of 0.06 Torr into the chamber. The electrodes are maintained at a given high temperature, e.g., 1100 to 1200° C., and a voltage of 4 to 6 kV is applied between the electrodes to thereby form the nanotubes 22 of Cr—C on the lower electrode layer 16 as the anode.

After forming the nanotubes 22, an $SiO_2$ film having a thickness of 50 nm as the insulator matrix 20 is continuously deposited by sputtering. A resist pattern is next formed on the $SiO_2$ film, and the $SiO_2$ film is next etched by using the resist pattern as a mask to remove an unwanted portion of the $SiO_2$ film. Further, a resist pattern is formed again on the $SiO_2$ film, and the $SiO_2$ film is next partially etched by using the resist pattern as a mask to form the nanotube structure film 18 whose central region as a contact hole has a thickness of 10 nm.

Thereafter, the magnetoresistive film 28 having a thickness of 40 nm is deposited on the nanotube structure film 18 by sputtering. The magnetoresistive film 28 includes at least one low-resistance film and at least two ferromagnetic films sandwiching the low-resistance film. Alternatively, the magnetoresistive film 28 has a ferromagnetic tunnel junction structure or a multilayer film structure composed of a ferromagnetic layer and a nonmagnetic layer. In other words, the magnetoresistive film 28 may be provided by a spin valve GMR film such as a NiFe/Cu/NiFe/IrMn multilayer film, a laminated ferri spin valve GMR film such as a NiFe/Cu/CoFeB/Ru/CoFeB/PdPtMn multilayer film, or a tunnel junction type MR film (TMR film) such as a NiFe/$Al_2O_3$/NiFe/PdPtMn multilayer film.

Thereafter, a Cu film having a thickness of 300 nm as the upper electrode layer 30 is deposited on the magnetoresistive film 28 by sputtering. A resist pattern is next formed on the Cu film, and the Cu film is next etched by using the resist pattern as a mask to form the upper electrode layer 30 having a desired shape. Thus, the magnetoresistive sensor 14 is completed. A magnetoresistive sensor as a comparison was fabricated in the following manner. A plurality of Cr—C nanotubes each having a length of 10 nm were formed on a lower electrode layer. Thereafter, an $SiO_2$ film having a thickness of 30 nm was deposited on the lower electrode layer so as to fully cover the nanotubes, thus forming a nanotube structure film. Thereafter, the nanotube structure film was not etched, and a magnetoresistive film and an upper electrode layer are sequentially deposited on the nanotube structure film.

By using samples of the comparison and the present invention, the resistance was measured by a DC four-terminal method. Table 1 shows the results of measurement of the output and resistance in the present invention and the comparison together with the prior art magnetoresistive sensor having a CPP structure. The measurement of the output was made by a normal four-terminal method under the conditions of 2 mA for a current and $10^5$ A/m for an applied magnetic field.

TABLE 1

|  |  | Resistance (Ω.cm) | Output (mV) |
|---|---|---|---|
| Present Invention | 10 nm long Cr—C nanotubes and a 10 nm thick $SiO_2$ film were used as the contact hole in the magnetoresistive sensor. | $10^2$ | 10 |
| Comparison | 10 nm long Cr—C nanotubes and a 30 nm thick $SiO_2$ film were used as the contact hole in the magnetoresistive sensor. | $10^4$ | 0 |
| Prior Art | The magnetoresistive sensor having a CPP structure | 10 | 1 |

As apparent from Table 1, an output of 10 mV is obtained by the magnetoresistive sensor of the present invention, and an output of 1 mV is obtained by the prior art magnetoresistive sensor. That is, the output by the present invention is 10 times the output by the prior art. Accordingly, it is confirmed that the nanotube structure film according to the present invention can reduce the diameter of the contact hole and can improve the output. In Table 1, the output by the comparison is zero for the reason that all the nanotubes as the contact hole are fully embedded in the $SiO_2$ film, so that no conduction can be made between the magnetoresistive film 28 and the lower electrode layer 16.

The number of the nanotubes functioning as the contact hole in the nanotube structure film in this preferred embodiment will now be calculated. The diameter of the contact hole in the prior art magnetoresistive sensor is 0.2 μm. Therefore, the apparent diameter D' of the contact hole in the magnetoresistive sensor of the present invention whose output obtained is 10 times that of the prior art magnetoresistive sensor becomes $0.2 \times 1/10^{1/2} \approx 0.063$ μm. Assuming that the diameter of the circular cylindrical metal 26 of each nanotube 22 is 8 nm, the number n of the nanotubes 22 as the contact hole is estimated to be $0.063^2/0.008^2 \approx 62$.

According to the present invention as described above, it is possible to provide a magnetoresistive sensor having a CPP structure which can reduce the apparent diameter of a contact hole and can improve an output. Furthermore, by considering the conditions of formation of the nanotube structure film, the size and number of effective nanotubes as a contact hole can be controlled.

What is claimed is:

1. A magnetoresistive sensor comprising:
   upper and lower electrode layers;
   a conducting path layer provided between said upper and lower electrode layers, said conducting path layer being formed by arranging a cylinder in an insulator, said cylinder comprising a tubular nonmetal and a cylindrical metal surrounded by said tubular nonmetal; and
   a magnetoresistive film provided between said conducting path layer and one of said upper and lower electrode layers.

2. A magnetoresistive sensor comprising:
   upper and lower electrode layers;
   a conducting path layer provided between said upper and lower electrode layers, said conducting path layer being formed by arranging in an insulator matrix at least one cylindrical metal in a tube having high resistivity, said conducting path layer having a first region and a second region smaller in film thickness than said first region; and
   a magnetoresistive film provided between said conducting path layer and one of said upper and lower electrode layers.

3. A magnetoresistive sensor according to claim 1, wherein said tubular nonmetal is formed of a material different from that of said insulator.

4. A magnetoresistive sensor according to claim 3, wherein said tubular nonmetal contains carbon.

5. A magnetoresistive sensor according to claim 1, wherein said cylindrical metal contains chromium.

6. A magnetoresistive sensor according to claim 1, wherein said insulator is formed of $SiO_2$.

7. A manufacturing method for a magnetoresistive sensor, comprising the steps of:
   depositing a lower electrode layer on a substrate;
   forming a cylindrical metal surrounded by a tubular nonmetal on said lower electrode layer;

depositing an insulator on said lower electrode layer after forming said cylindrical metal so that said cylindrical metal is embedded in said insulator to thereby form a conducting path layer;

depositing a magnetoresistive film on said conducting path layer; and depositing an upper electrode layer on said magnetoresistive film.

8. A manufacturing method according to claim 7, further comprising the steps of forming a resist pattern on said conducting path layer before depositing said magnetoresistive film; and partially etching said conducting path layer by using said resist pattern as a mask.

9. A magnetoresistive sensor comprising:

a lower electrode layer;

a nanotube structure film provided on said lower electrode layer, said nanotube structure film comprising an insulator matrix and a plurality of nanotubes dispersively arranged in said insulator matrix;

a magnetoresistive film provided on said nanotube structure film; and an upper electrode layer provided on said magnetoresistive film;

each of said nanotubes comprising a circular tubular nonmetal and a circular cylindrical metal surrounded by said circular tubular nonmetal;

said nanotube structure film being partially etched at a central on thereof to make conduction of said upper electrode layer and said lower electrode layer through said magnetoresistive film and said circular cylindrical metal of each nanotube present at said central region.

10. A magnetoresistive sensor according to claim 9, wherein said circular tubular nonmetal is formed of carbon, and said circular cylindrical metal is formed of chromium.

11. A magnetoresistive sensor according to claim 10, wherein said insulator matrix is formed of $SiO_2$.

12. A manufacturing method for a magnetoresistive sensor, comprising the steps of:

depositing a lower electrode layer on a substrate;

forming a first resist pattern on said lower electrode layer;

etching said lower electrode layer by using said first resist pattern as a mask to form said lower electrode layer into a desired shape;

forming a plurality of nanotubes of Cr—C on said lower electrode layer;

depositing an insulator matrix on said lower electrode layers that said plurality of nanotubes are embedded in said insulator matrix to form nanotube structure film;

forming a second resist pattern on said nanotube structure film;

etching said nanotube structure film by using said second resist pattern as a mask to remove an unwanted portion of said nanotube structure film;

forming a third resist pattern on said nanotube structure film;

etching a central region of said nanotube structure film so that the top of each nanotube present at said central region is exposed, by using said third resist pattern as a mask;

depositing a magnetoresistive film on said nanotube structure film;

depositing an upper electrode layer on said magnetoresistive film;

forming a fourth resist pattern on said upper electrode layer; and etching said upper electrode layer by using said fourth resist pattern as a mask to form said upper electrode layer into a desired shape.

13. A manufacturing method according to claim 12, wherein each nanotube comprises a circular tube formed of C and a circular cylinder formed of Cr, said circular cylinder being surrounded by said tubular tube.

* * * * *

UNITED STATES PATENT AND TRADEMARK OFFICE
CERTIFICATE OF CORRECTION

PATENT NO. : 6,828,039 B2  Page 1 of 1
DATED : December 7, 2004
INVENTOR(S) : Suguwara It is certified that error appears in the above-identified patent and that said Letters Patent is hereby corrected as shown below:

Column 9,
Line 31, delete "central on" and insert -- central region --.

Signed and Sealed this

Twenty-fourth Day of May, 2005

JON W. DUDAS
*Director of the United States Patent and Trademark Office*